United States Patent
Ikeuchi et al.

(10) Patent No.: US 10,608,670 B2
(45) Date of Patent: Mar. 31, 2020

(54) CONTROL DEVICE, METHOD AND NON-TRANSITORY COMPUTER-READABLE STORAGE MEDIUM

(71) Applicant: FUJITSU LIMITED, Kawasaki-shi, Kanagawa (JP)

(72) Inventors: Kazuhiko Ikeuchi, Kawasaki (JP); Chikashi Maeda, Kawasaki (JP); Yukari Tsuchiyama, Kawasaki (JP); Guangyu Zhou, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 30 days.

(21) Appl. No.: 16/120,532

(22) Filed: Sep. 4, 2018

(65) Prior Publication Data
US 2019/0081643 A1  Mar. 14, 2019

(30) Foreign Application Priority Data
Sep. 11, 2017 (JP) ................................ 2017-173629

(51) Int. Cl.
*H03M 13/29* (2006.01)
*G06F 11/10* (2006.01)

(52) U.S. Cl.
CPC ..... *H03M 13/2906* (2013.01); *G06F 11/1076* (2013.01)

(58) Field of Classification Search
CPC ................ H03M 13/2906; G06F 11/1076
See application file for complete search history.

(56) References Cited

U.S. PATENT DOCUMENTS

| 5,734,859 | A | 3/1998 | Yorimitsu et al. |
| 6,145,058 | A | 11/2000 | Suganuma |
| 9,244,849 | B2* | 1/2016 | Doi ..................... G06F 12/0873 |
| 2002/0103969 | A1* | 8/2002 | Koizumi ............... G06F 3/0605 |
| | | | 711/114 |

(Continued)

FOREIGN PATENT DOCUMENTS

| JP | 07-110788 | 4/1995 |
| JP | 10-293717 | 11/1998 |
| JP | 2003-263365 | 9/2003 |

OTHER PUBLICATIONS

Chung, C-C., et al., "Partial Parity Cache and Data Cache Management Method to Improve the Performance of an SSD-Based Raid," IEEE Transactions on Very Large Scale Integration (VLSI) Systems, vol. 22, Issue: 7, Jul. 2014, pp. 1470-1480. (Year: 2014).*

*Primary Examiner* — Kyle Vallecillo
(74) *Attorney, Agent, or Firm* — Fujitsu Patent Center

(57) ABSTRACT

A control device is configured to receive a first write request of first data, calculate a first parity of the first data, store the first data and the first parity into a storage region so that the first data is stored redundantly, identify a certain area which has a possibility that a write process to the certain area is requested after a read process from the certain area is requested, receive a read request of the first data stored in the certain area, read the first data and the first parity, and store the first data and the first parity into a memory, receive a second write request of a second data, calculate a second parity based on the second data, the first data stored in the memory and the first parity stored in the memory, and store the second data and the second parity into the storage region.

18 Claims, 12 Drawing Sheets

(56) References Cited

U.S. PATENT DOCUMENTS

| | | | |
|---|---|---|---|
| 2011/0246717 A1* | 10/2011 | Kobayashi | G06F 11/1096 711/114 |
| 2011/0320717 A1* | 12/2011 | Doi | G06F 12/0873 711/118 |
| 2012/0278569 A1* | 11/2012 | Kawakami | G06F 3/0608 711/162 |
| 2013/0054907 A1* | 2/2013 | Ikeuchi | G06F 11/1092 711/159 |
| 2014/0189202 A1* | 7/2014 | Hosaka | G06F 12/0246 711/103 |
| 2014/0297926 A1* | 10/2014 | Ono | G06F 3/0688 711/103 |
| 2015/0095572 A1* | 4/2015 | Koike | G06F 3/0634 711/114 |
| 2015/0154075 A1* | 6/2015 | Sugimoto | G06F 11/1096 714/6.24 |
| 2016/0306553 A1* | 10/2016 | Ellis | G06F 3/0611 |

\* cited by examiner

FIG. 5

| TIME | VOLUME NUMBER | STARTING ADDRESS | DATA SIZE |
|---|---|---|---|
| aa:bb:cc:dd:ee:ff | xx | yyyy | zzzz |
| ... | ... | ... | ... |
| ... | ... | ... | ... |

114

FIG. 10
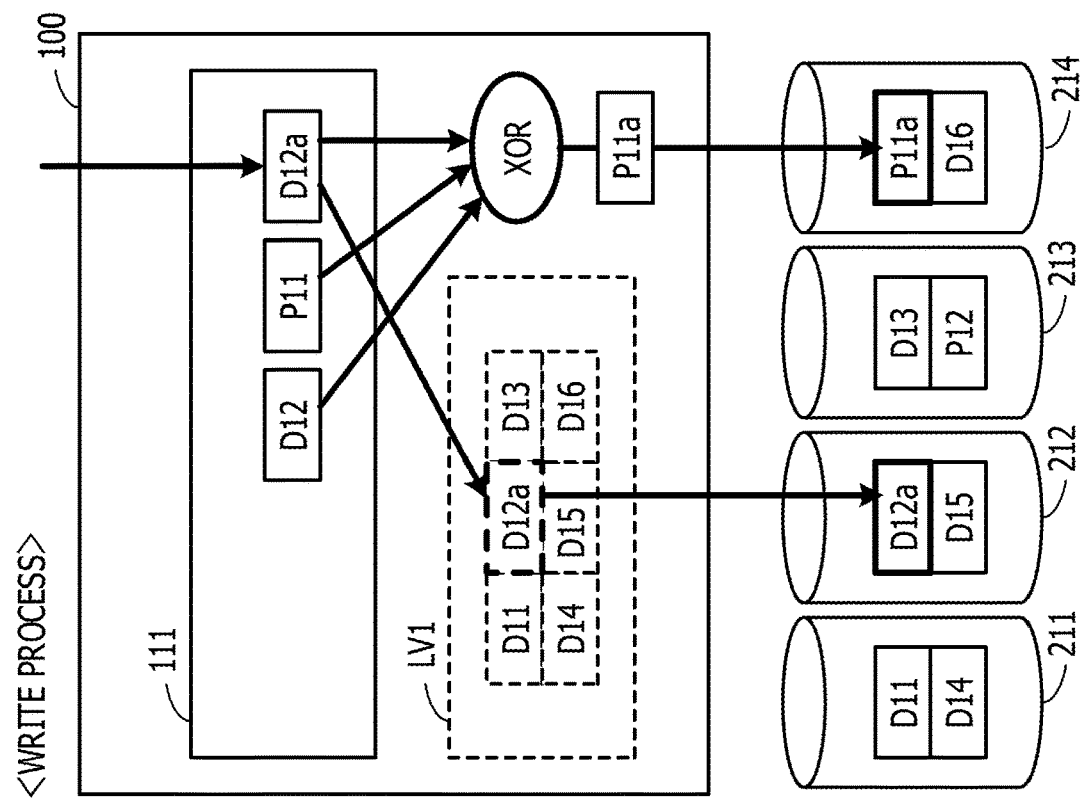
<WRITE PROCESS>
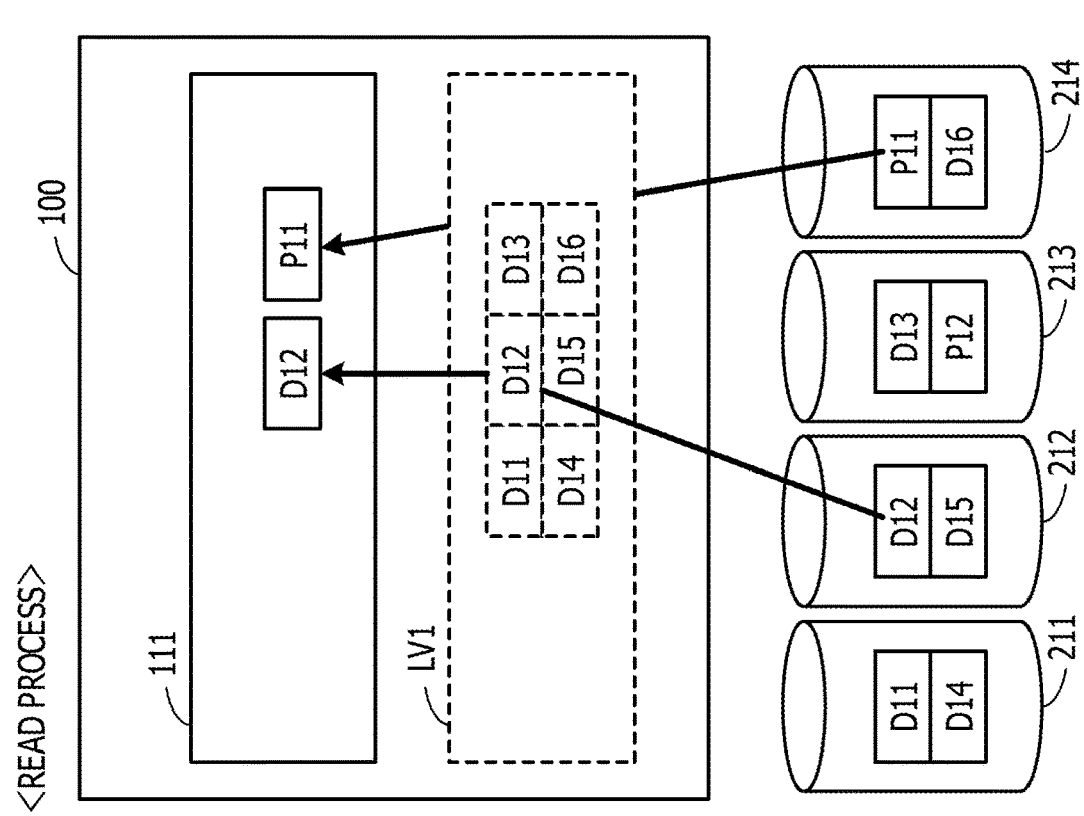
<READ PROCESS>

CONTROL DEVICE, METHOD AND NON-TRANSITORY COMPUTER-READABLE STORAGE MEDIUM

CROSS-REFERENCE TO RELATED APPLICATIONS

This application is based upon and claims the benefit of priority of the prior Japanese Patent Application No. 2017-173629, filed on Sep. 11, 2017, the entire contents of which are incorporated herein by reference.

FIELD

The embodiments discussed herein are related to a control device, a method and a non-transitory computer-readable storage medium.

BACKGROUND

The redundant arrays of inexpensive disks (RAID) technology is used widely in storage systems. The RAID technology provides higher protection for recorded data by performing recoding control such that the data is made redundant and is stored on two or more storage devices. The RAID technology includes multiple recording control modes (RAID levels). For example, in recording control modes such as RAID 4, RAID 5, and RAID 6, data is made redundant using parities. To put it specifically, the control is performed such that: one or more parities are calculated based on a certain number of data; and the data and the parities are recorded respectively in different storage devices.

The recording control modes using the parities like this request a storage device group controlled by RAID to be accessed multiple times during each write process. This causes problems that the amount of time requested to complete the write process is longer and the process load is higher. For example, in the case of RAID 5, once data is requested to be updated, the pre-updated old data and old parity calculated based on the old data are read from the storage device group. Thereafter, new parity is calculated based on the old data, the old parity, and the new data obtained through the updating, as well as the new data and the new parity are written to the storage device group. Like this, accesses such as the reading of the old data and the old parity are performed during the write process. These accesses are called "write penalty". Once the occurrence of the write penalty like this increases load on the write process, there is likelihood that the access performance of the storage system as a whole deteriorates.

Against this background, there has been a proposal for a technique in which when data is requested to be read, read data (corresponding to the old data) and parity (corresponding to the old parity) calculated using the read data are staged on a cache memory. This technique makes it possible to calculate new parity based on the old data and the old parity staged in the cache memory, as well as write data (corresponding to the new data) when data is requested to be read. This requests neither the old data nor the old parity to be read from the storage device group, and avoids the occurrence of the write penalty. Among prior art documents are Japanese Laid-open Patent Publications Nos. 2003-263365 and 7-110788.

An aspect of the embodiment discussed herein aims at providing a storage control device and a storage control program which are capable of reducing the load on the write process while using a small storage capacity.

SUMMARY

According to an aspect of the invention, a control device includes a memory, and a processor coupled to the memory and configured to receive, from an information processing apparatus, a first write request to store first data into a storage apparatus including a storage region, calculate a first parity corresponding to the first data, store the first data and the first parity into the storage region so that the first data is stored redundantly by using the first parity, based on a plurality of accesses to the storage region from the information processing apparatus, identify a certain area which is included in the storage region and has a possibility that a write process to the certain area is requested after a read process from the certain area is requested, receive, from the information processing apparatus, a read request which requests to read the first data stored in the storage region, when at least a part of the first data is stored in the certain area, read the first data and the first parity from the storage region, and store the first data and the first parity into the memory, transmit the read first data to the information processing apparatus, receive, from the information processing apparatus, a second write request which requests to store a second data into the storage region so that the first data is updated by the second data, calculate second parity based on the second data, the first data stored in the memory and the first parity stored in the memory, and store the second data and the second parity into the storage region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating an example of a data configuration of history information.

FIG. 10 is a diagram illustrating specific examples of the read process and a specific example of the write process.

DESCRIPTION OF EMBODIMENTS

The staging of old data and old parities in advance requests a storage region for storing the old data and the old parities, and causes a problem of increasing the capacity of the storage region.

First Embodiment

Figure 1:
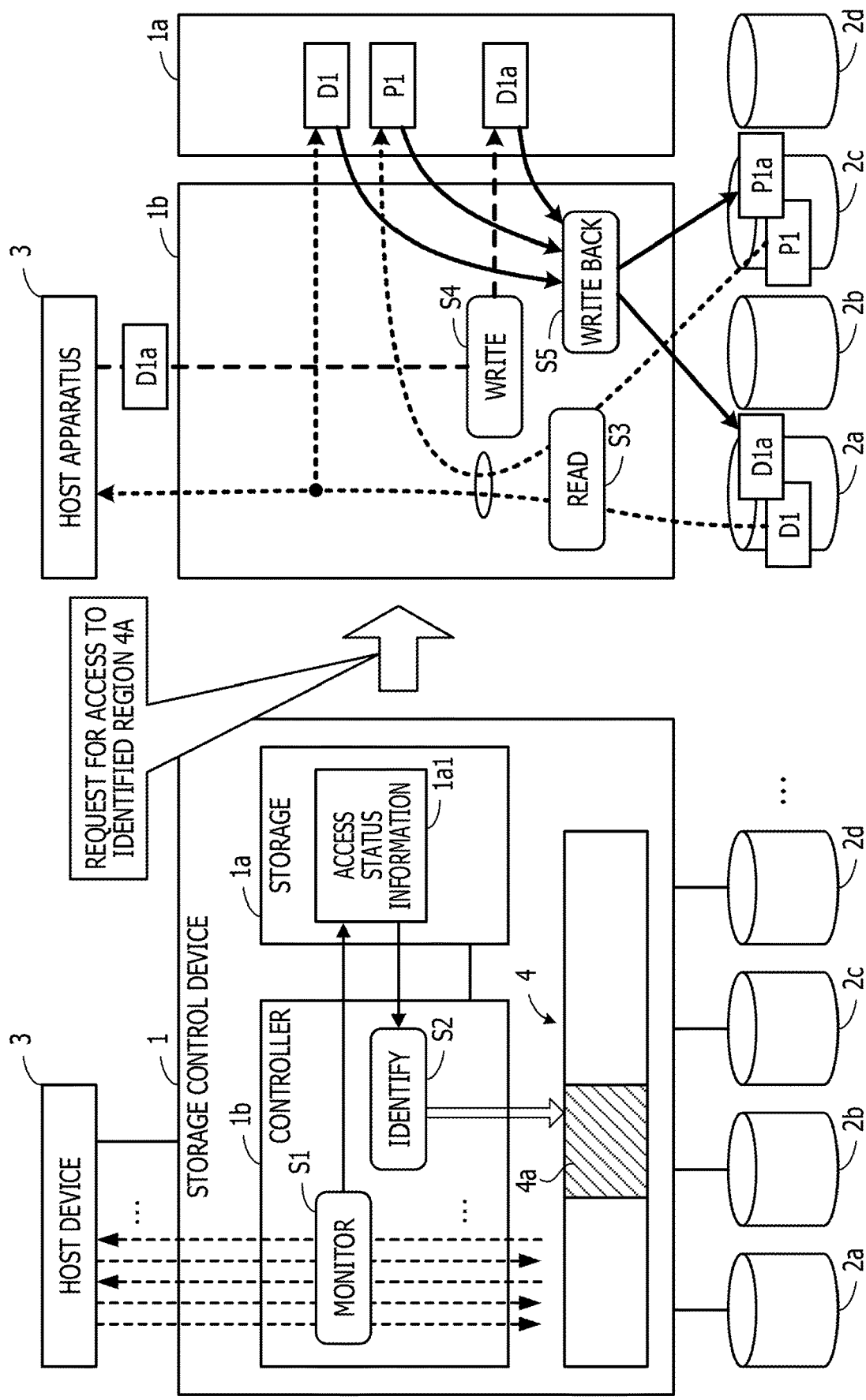
FIG. 1 is a diagram illustrating an example of a configuration of a storage control device according to a first embodiment, and an example of a process to be performed by the storage control device.

FIG. 1 is a diagram illustrating an example of a configuration of a storage control device according to a first embodiment, and an example of a process to be performed by the storage control device. The storage control device 1 illustrated in FIG. 1 is coupled to storage units 2a, 2b, 2c, 2d, . . . and a host apparatus 3. In response to an access request from the host apparatus 3, the storage control device 1 performs access control on a logical storage region 4. The logical storage region 4 is implemented using some of the storage units 2a, 2b, 2c, 2d, . . . .

The storage control device 1 includes a storage 1a and a controller 1b. The storage 1a is implemented, for example, as a storage region in a memory (not illustrated) included in the storage control device 1. The controller 1b is implemented, for example, as a processor included in the storage control device 1.

As discussed later, the storage 1a stores data and parities read from the storage units 2a, 2b, 2c, 2d, . . . . In this embodiment, as an example, the storage 1a stores access status information 1a1. The access status information 1a1 registers information on a result of monitoring the request issued from the host apparatus 3 for access to the logical storage region 4.

In response to the access request from the host apparatus 3, the controller 1b performs the access control on the logical storage region 4. In this access control, the controller 1b controls a write process in response to the write request from the host apparatus 3 to make data redundant using parities.

For example, when the controller 1b performs a write process on a predetermined number of data existing in consecutive address areas on the logical storage region 4, the controller 1b calculates parities based on the data. The controller 1b writes the data and the parities to mutually-different ones of the multiple storage units assigned to the logical storage region 4.

In addition, the controller 1b monitors the request issued from the host apparatus 3 for the access to the logical storage region 4 (step S1). In this embodiment, the controller 1b registers the access request monitoring result in the access status information 1a1.

Based on the access request monitoring result registered in the access status information 1a1, the controller 1b identifies a storage area having high possibility of being a target of a write request after a read request from the logical storage region 4 (step S2). The identified storage area is hereinafter referred to as an "identified area". It is assumed that the identified area 4a is identified in the case illustrated in FIG. 1.

Thereafter, once the request for the access to the identified area 4a is issued, a process as follows is performed.

It is assumed that the controller 1b receives a request to read data D1 included in the identified area 4a from the host apparatus 3. The data D1 is stored on the storage unit 2a, and parity P1 calculated using the data D1 is stored on the storage unit 2c. The controller 1b reads the read-requested data D1 from the storage unit 2a, and stores the data D1 into the storage 1a, as well as sends the data D1 to the host apparatus 3. Furthermore, the controller 1b reads the parity P1 from the storage unit 2c, and stores the parity P1 into the storage 1a (step S3).

It is assumed that thereafter, the controller 1b receives a request to write data D1a for updating the data D1 from the host apparatus 3. If it is assumed that a method of performing a write-back process asynchronously with the write process is employed, the controller 1b stores the data D1a received from the host apparatus 3 into the storage 1a, and sends a write completion response to the host apparatus 3 (step S4). Incidentally, the data D1a is stored into a storage area which is different from that where the pre-updated data D1 is stored.

After that, the controller 1b performs the write-back process on the data D1a in the following way. The controller 1b reads the data D1, the parity P1, and the data D1a from the storage 1a, and calculates new parity P1a based on the data D1, the parity P1, and the data D1a. The controller 1b stores the data D1a into the storage unit 2a to update the data D1, and stores the parity P1a into the storage unit 2c to update the parity P1 (step S5).

The write-back process does not request the pre-updated data D1 or the pre-updated parity P1 to be read from the storage unit 2a or the storage unit 2c, respectively. This decreases the amount of time requested to complete the write-back process, and reduces the accompanying process load. It is accordingly possible to decrease the amount of time requested to complete the entirety of the write process in response to the write request, and to reduce the accompanying process load.

Noted that in a case where a write-through method of performing a write-back process before the sending of the write completion response is employed, a write-back process as follows is performed before the sending of the write completion response. The controller 1b calculates the parity P1a based on the data D1 and the parity P1 read from the storage 1a, as well as the data D1a received from the host apparatus 3. The controller 1b stores the data D1a into the storage unit 2a to update the data D1, and stores the parity P1a into the storage unit 2c to update the parity P1.

Even in the case where the write-through process is employed like this, the write-back process does not request the pre-updated data D1 or the pre-updated parity P1 to be read from the storage unit 2a or the storage unit 2c, respectively. This decreases the amount of time requested to complete the write-back process, and reduces the accompanying process load. It is accordingly possible to decrease the amount of time requested to complete the entirety of the write process in response to the write request, and to reduce the accompanying process load.

In the process performed by the controller 1b as discussed above, the storage area having the high possibility of being the target of the write request after the read request is identified as the identified area 4a from the logical storage region 4. Thereafter, once the request to read the data included in the identified area 4a is issued, the data and the parity calculated based on the data are stored into the storage 1a.

Thereby, only the old parity having a high possibility of being used to calculate the new parity in the write-back process is stored into the storage 1a in advance. This makes it possible to reduce the storage capacity of the storage 1a for storing the parities while maintaining the effect of decreasing the amount of time requested to complete the entirety of the write process, and the effect of reducing the accompanying process load. Accordingly, using the smaller storage capacity, it is possible to decrease the amount of time requested to complete the entirety of the write process, and to reduce the accompanying process load.

Second Embodiment

Figure 2:
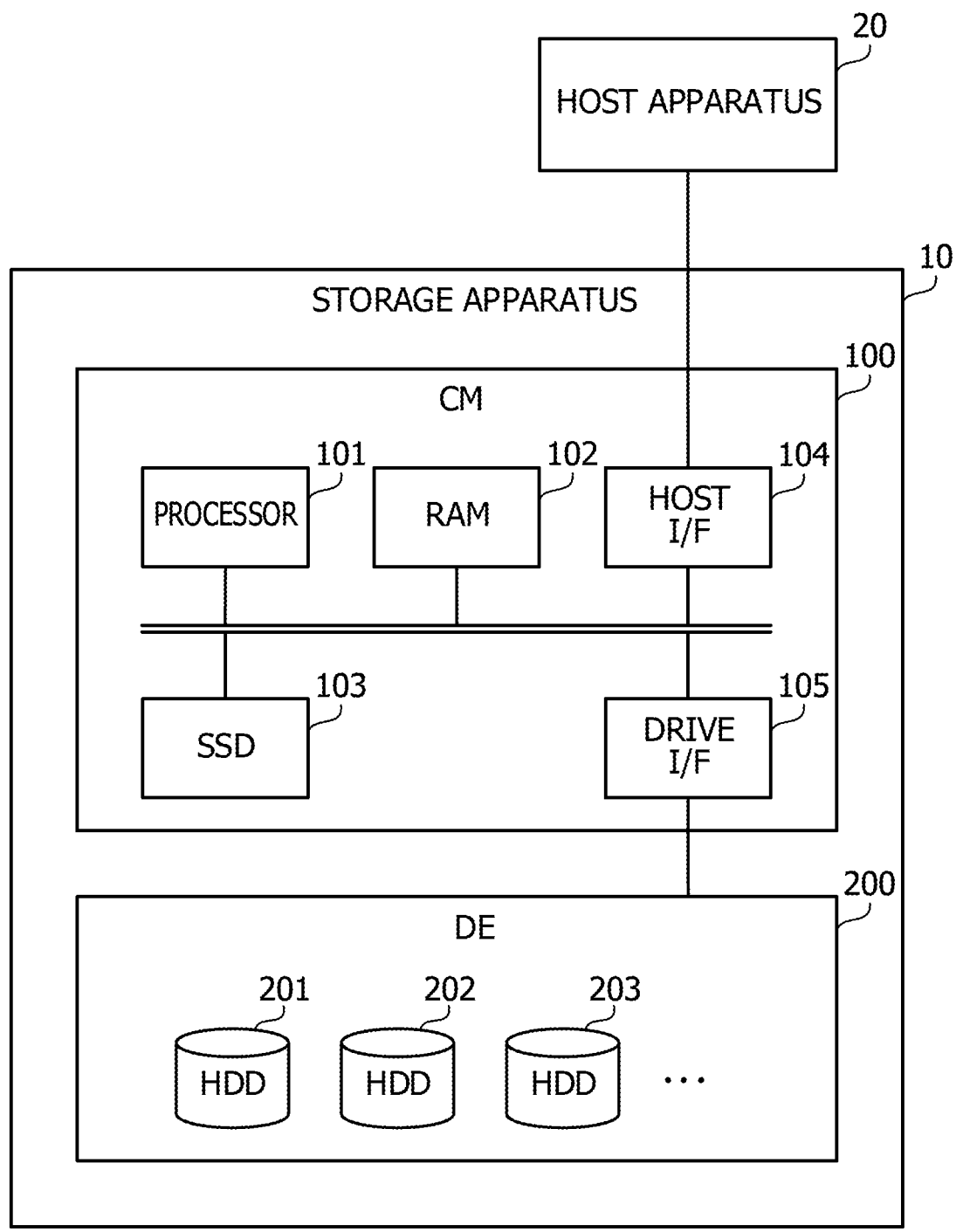
FIG. 2 is a diagram illustrating an example of a configuration of a storage system according to a second embodiment.

FIG. 2 is a diagram illustrating an example of a configuration of a storage system according to a second embodiment. The storage system illustrated in FIG. 2 includes a storage apparatus 10 and a host apparatus 20. The storage apparatus 10 includes a controller module (CM) 100 and a drive enclosure (DE) 200. The host apparatus 20 is coupled to the CM 100.

The CM 100 is a storage control device which accesses storage units installed in the DE 200 in response to a request from the host apparatus 20. To put it specifically, the CM 100 sets logical volumes using storage areas in the storage units installed in the DE 200, and receives requests for accesses to the logical volumes from the host apparatus 20.

Hard disk drives (HDDs) 201, 202, 203, . . . , as the storage units to be accessed from the host apparatus 20, are installed in the DE 200. Incidentally, the storage units to be installed in the DE 200 are not limited to the HDDs, and may be different types of non-volatile storage devices such as solid state drives (SSDs).

The host apparatus 20 is, for example, a computer which performs various business processes. Incidentally, the host apparatus 20 and the CM 100 are coupled together, for example, through a storage area network (SAN) using Fiber Channel (FC), Internet Small Computer System interface (iSCSI), or the like.

Next, referring to FIG. 2, descriptions are provided for an example of a hardware configuration of the CM 100. The CM 100 includes a processor 101, a random access memory (RAM) 102, a SSD 103, a host interface (I/F) 104, and a drive interface (I/F) 105.

The processor 101 centrally controls the entirety of the CM 100. The processor 101 is, for example, one of a central processing unit (CPU), a micro processing unit (MPU), a digital signal processor (DSP), an application specific integrated circuit (ASIC), a graphics processing unit (GPU), and a programmable logic device (PLD). Otherwise, the processor 101 may be a combination of two or more of the CPU, the MPU, the DSP, the ASIC, the GPU, and the PLD.

The RAM 102 is the main storage device in the CM 100. The RAM 102 temporarily stores at least parts of the operating system (OS) program and application programs to be executed by the processor 101. The RAM 102 further stores various data to be used for the processes by the processor 101.

The SSD 103 is an auxiliary storage device in the CM 100. The SSD 103 stores the OS programs, the application programs, and various data. Incidentally, the CM 100 may include a HDD as the auxiliary storage device, instead of the SSD 103.

The host interface 104 is an interface to be used for communications with the host apparatus 20. The drive interface 105 is an interface to be used for communications with the HDDs 201, 202, 203, . . . in the DE.

Figure 3:
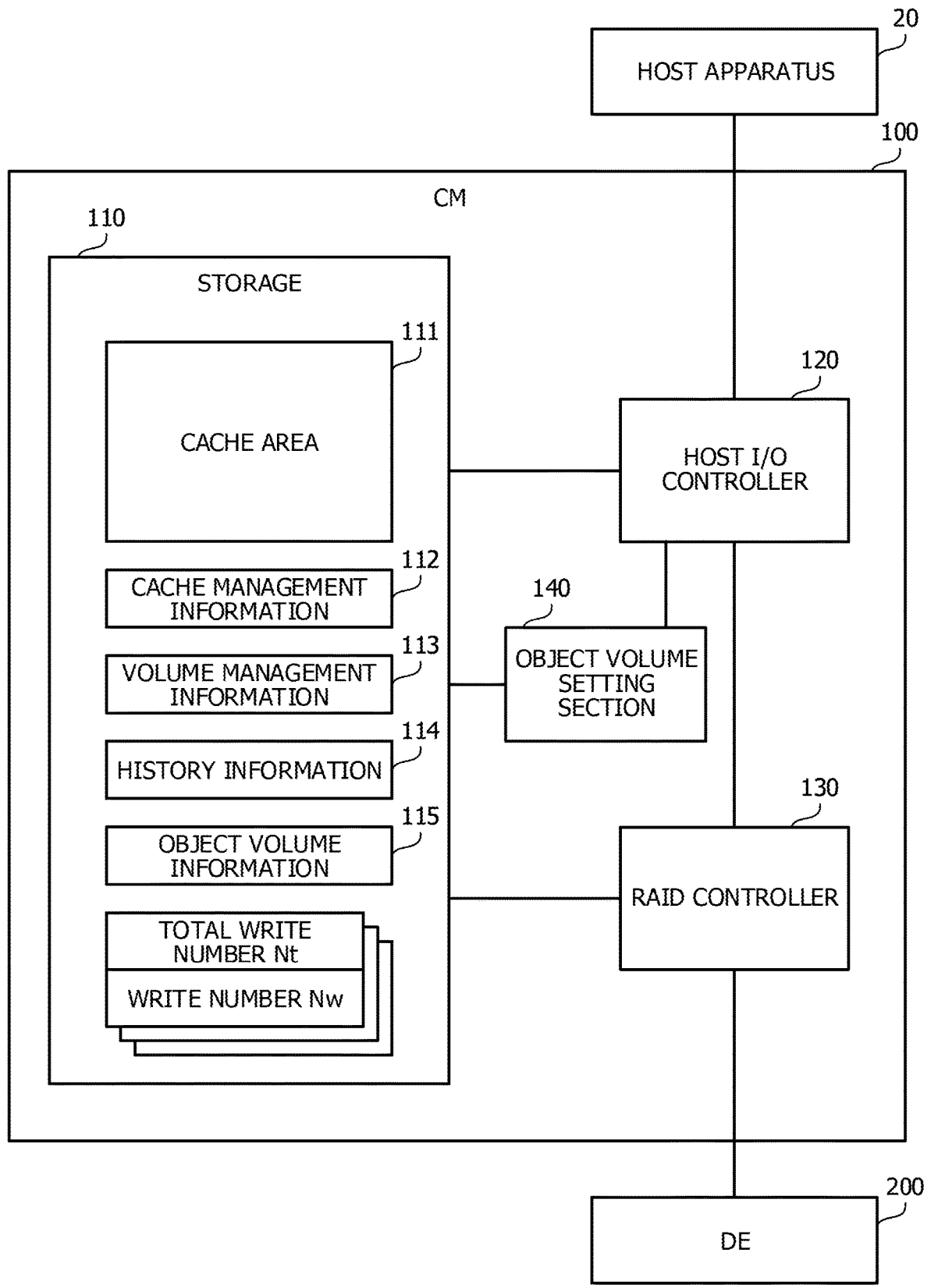
FIG. 3 is a block diagram illustrating an example of a configuration for a process function to be performed by a controller module.

FIG. 3 is a block diagram illustrating an example of a configuration for the process functions to be performed by the CM. The CM 100 includes a storage 110, a host I/O controller 120, a RAID controller 130, and an object volume setting section 140. The storage 110 is implemented as a storage area of a memory (for example, the RAM 102) included in the CM 100. The processes to be performed by the host I/O controller 120, the RAID controller 130, and the object volume setting section 140 are implemented by the processor 101's execution of predetermined programs.

A cache area 111 is secured in the storage 110. Data to be read from and written to the logical volumes are cached in the cache area 111. Relevant parities, although discussed later, are cached in the cache area 111 as well.

The storage 110 further stores cache management information 112, volume management information 113, history information 114, and object volume information 115.

The cache management information 112 is information for managing the use status of the cache area 111. The cache management information 112 includes entries to the respective cache pages in the cache area 111. Each entry registers information on the data stored in the corresponding cache page.

The volume management information 113 registers information on each logical volume set in the CM 100. For each logical volume, the volume management information 113 registers, for example, a volume name for identifying the logical volume, a RAID level to be used to control write to the logical volume, and identification information on a HDD assigned as a physical storage area to the logical volume.

For each logical volume, the history information 114 registers history of requests from the host apparatus 20 to read from the logical volume.

The object volume information 115 registers a volume name of an "object volume" where to stage the relevant parity (discussed later) which is selected from the volume names of the set logical volumes.

The storage 110 further stores total write numbers Nt and write numbers Nw, which are statistical data to be used to determine the object volume. A total write number Nt and a write number Nw are set for each logical volume. The total write number Nt is a total number of requests to write to the logical volume. The write number Nw is the number of requests to write to a block on the logical volume which are made immediately after the requests to read from the same block thereon. The write number Nw is counted up each time a write to the block is requested within a predetermined time after a read from the same block is requested.

Noted that the total write number Nt, the write number Nw, and the history information 114 for each logical volume are used as the statistical data for determining the object volume.

The host I/O controller 120 receives an I/O request to write to (or to read from) each logical volume from the host apparatus 20, and performs an I/O process on the logical volume in response to the I/O request. To this end, the host I/O controller 120 uses the cache area 111.

For example, upon receipt of a request to read data from a logical volume, the host I/O controller 120 determines whether the read data is stored on the cache area 111 by referring to the cache management information 112. If the read data is stored on the cache area 111, the host I/O controller 120 reads the read data from the cache area 111, and sends the read data to the host apparatus 20.

On the other hand, if the read data is not stored on the cache area 111, the host I/O controller 120 obtains the read data from the DE 200 via the RAID controller 130. At this point, if a logical volume of a read source is set as the object volume, the host I/O controller 120 obtains the relevant parity corresponding to the read data from the DE 200 via the RAID controller 130. The relevant parity is parity which is requested to calculate a new parity in a case where the read data is thereafter updated and the updated data is written back to the DE 200. Furthermore, the relevant parity is parity which is calculated using the read data and is written to the DE 200.

The host I/O controller 120 stores the obtained read data into the cache area 111, and sends the obtained read data to the host apparatus 20. In addition, the host I/O controller 120 stores the obtained relevant parity into the cache area 111 as well. Like this, in the case where a read from the logical volume set as the object volume is requested, the read data and the relevant parity are staged in the cache area 111.

Meanwhile, upon receipt of a request to write data to a logical volume, the host I/O controller 120 stores the write data into the cache area 111. At this point, if the logical volume is set as the object volume and the relevant parity corresponding to the write data is stored on the cache area 111, the host I/O controller 120 stores the write data (new data) into a part of the cache area 111 which is different from the part where the pre-updated old data is stored. Thereafter, at a predetermined timing, the host I/O controller 120 causes the RAID controller 130 to perform a write-back process of reflecting the write data (new data) stored into the cache area 111 on the DE 200.

The RAID controller 130 controls accesses to the HDDs in the DE 200 which implement the physical storage areas for the logical volumes by use of the RAID technique. It is assumed that this embodiment employs RAID 5 as a RAID level. To put it specifically, the RAID controller 130 divides a logical volume into strips with a certain size. The RAID controller 130 performs the control such that: a predetermined number of consecutive strips and the strip-based parities are stored into mutually-different HDDs, respectively; and for each stripe (for each predetermined number of strips), the parities are distributed among mutually-different HDDs.

At this point, in a case where updated and new data is written back to a logical volume set as the object volume, the RAID controller 130 determines whether the relevant parity corresponding to the new data is stored on the cache area 111. If the relevant parity is stored on the cache area 111, the RAID controller 130 reads the new data, the old data, and the relevant parity from the cache area 111, and calculates a new parity based on the new data, the old data, and the relevant parity. The RAID controller 130 writes the new data and the new parity respectively to their corresponding HDDs in the DE 200. Like this, in the case where the relevant parity is stored on the cache area 111, the process of reading the old parity from the DE 200 is skipped, and the number of occurrences of the write penalty may be decreased.

For each logical volume, each time a write to the logical volume is requested, the object volume setting section 140 counts up the total write number Nt corresponding to the logical volume. Simultaneously, the object volume setting section 140 counts up the write number Nw corresponding to the logical volume based on the history information 114 in the case where a read from the same area is requested within a predetermined time before the write request. If based on the total write number Nt and the write number Nw, the object volume setting section 140 determines that the number of writes immediately after reads is larger in the logical volume that in any other logical volume, the object volume setting section 140 sets the logical volume as the object volume. In this case, the object volume setting section 140 registers the volume name of the logical volume in the object volume information 115.

Figure 4:
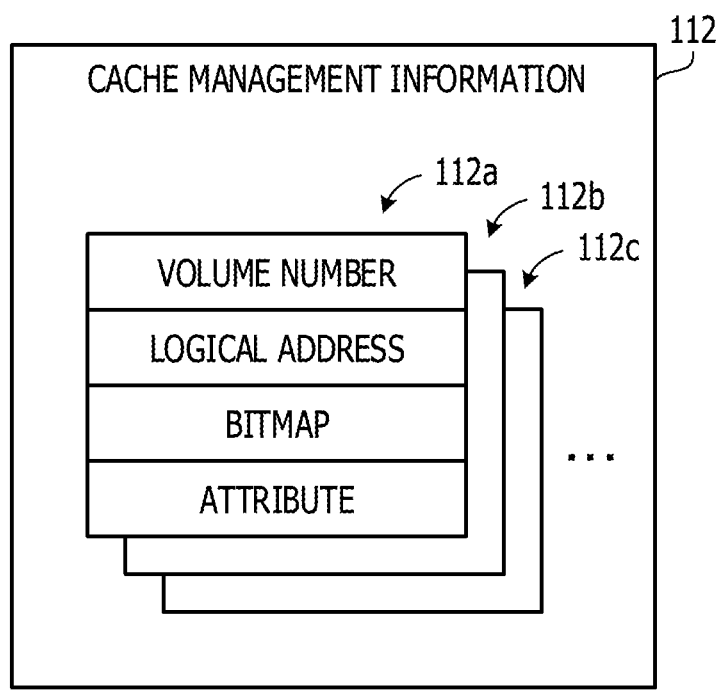
FIG. 4 is a diagram illustrating an example of a data configuration of cache management information.

FIG. 4 is a diagram illustrating an example of a data configuration for the cache management information. The cache management information 112 includes entries 112*a*, 112*b*, 112*c*, . . . to the respective cache pages on the cache area 111. The entries 112*a*, 112*b*, 112*c*, . . . are associated with the respective cache pages on the cache area 111 using a predetermined method.

Noted that each cache page has a size which covers the sizes of a predetermined number of logical blocks on the corresponding logical volume. For example, the size of each logical block is 512 bytes, and the size of the cache page is one megabyte. Besides, each cache page stores read data to be read from or write data to be written to a predetermined number of consecutive logical blocks. Furthermore, in this embodiment, each cache page may store the relevant parity in addition to the read data and the write data.

Each entry includes items such as a volume number, a logical address, a bitmap, and attributes. The volume number indicates which logical volume the data stored on the cache page corresponding to the entry belongs to. The logical address indicates a starting logical address on the logical volume which is assigned to the data stored on the cache page corresponding to the entry. The bitmap includes bit values which indicate the sizes of the logical blocks on the cache page. Each bit value indicates whether data is written to the corresponding logical block.

The attributes are attributes of the data stored on the cache page. The attributes include a read data attribute, a write data attribute, a new data attribute, and a parity attribute. The read data attribute represents read data which is staged on the cache page in response to a read request. The write data attribute represents write data which is stored into the cache page in response to a write request when no corresponding relevant parity is stored on the cache area 111. The new data attribute represents write data which is stored into the cache page in response to the write request when the corresponding relevant parity is stored on the cache area 111. The parity attribute represents the relevant parity.

FIG. 5 is a diagram illustrating an example of a data configuration of the history information. The history information 114 includes items such as time, a volume number, a starting address, and a data size. Each time a read request is received from the host apparatus 20, a record including information corresponding to the above items is registered in the history information 114.

The time indicates time when the read request is received. The volume number, the starting address, and the data size represent information on a range of readout specified by the read request. The volume number indicates an identification number of the logical volume to which the readout range belongs. The starting address indicates a starting logical address of the readout range, and the data size indicates the size of the readout range.

Next, using a flowchart, descriptions are provided for a process to be performed by the CM 100.

Figure 6:
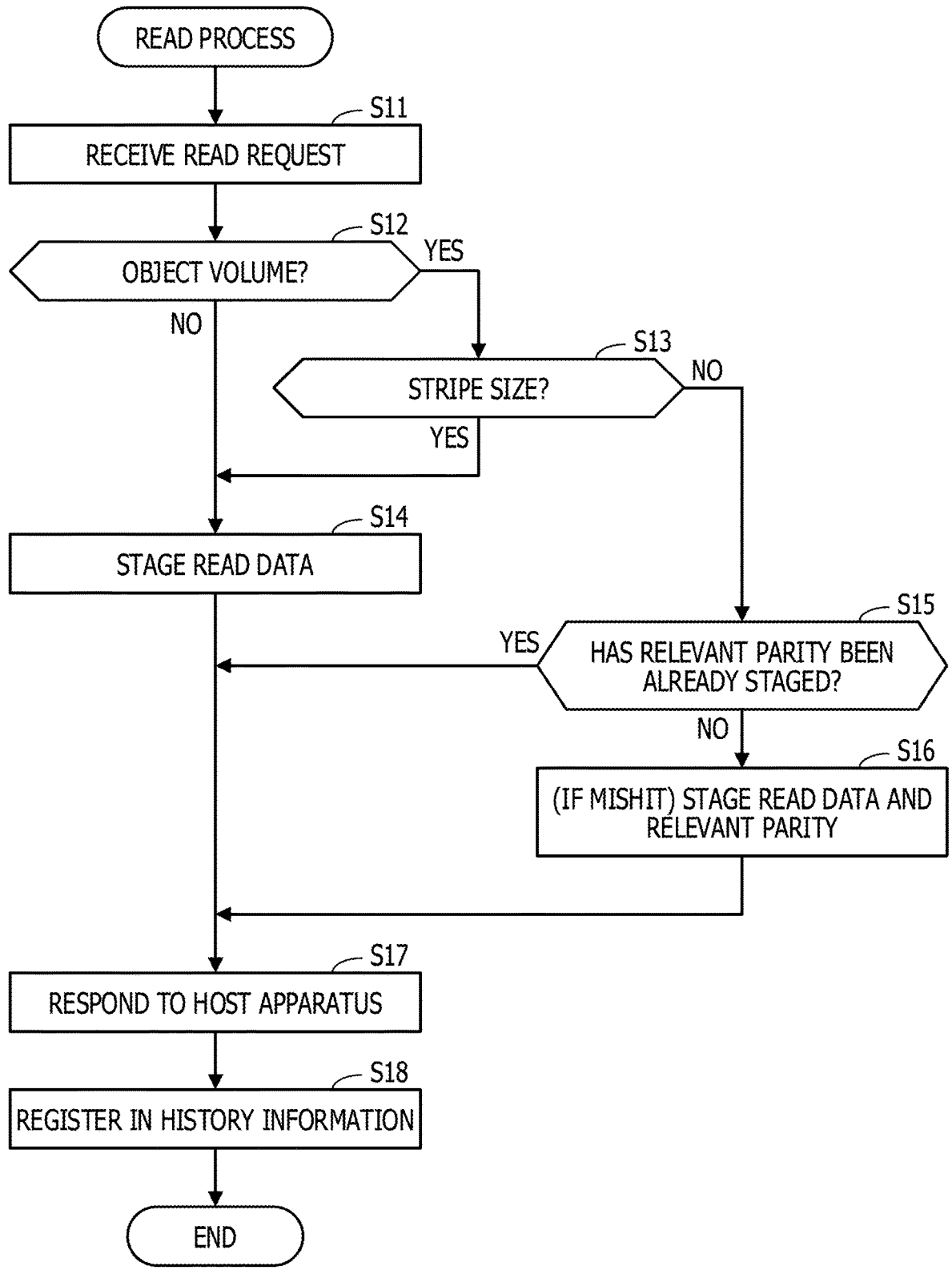
FIG. 6 is a flowchart illustrating an example of a read process.

To begin with, FIG. 6 is a flowchart illustrating an example of a read process. Incidentally, for the purpose of simplifying the descriptions, it is assumed that a stripe size is an upper limit of the size of data which may be read by one request in FIG. 6.

[Step S11] The host I/O controller 120 receives a read request from the host apparatus 20.

[Step S12] By referring to the object volume information 115, the host I/O controller 120 determines whether the read-requested logical volume is set as the object volume. If the logical volume is set as the object volume, the host I/O controller 120 performs a process in step S13. If the logical volume is not set as the object volume, the host I/O controller 120 performs a process in step S14.

[Step S13] The host I/O controller 120 determines whether the size of the read-requested data is equal to the stripe size. If the data size is equal to the stripe size, the host I/O controller 120 performs the process in step S14. If the data size is smaller than the stripe size, the host I/O controller 120 performs a process in step S15.

[Step S14] If the read-requested read data is not stored on the cache area 111 (if mishit), the host I/O controller 120 obtains the read data from the DE 200 via the RAID controller 130. The host I/O controller 120 stages the obtained read data into the cache area 111. At this point, an entry to the cache management information 112 corresponding to the cache page of a staging destination is set as having a read data attribute. Thereafter, information indicating that the read data is stored into the address range on the read-requested logical volume is registered in the entry.

Noted that the host I/O controller 120 skips the process in step S14 if the read data is stored on the cache area 111 (if cache hit).

[Step S15] Referring to the entry with the parity attribute registered therein which is selected from the entries in the cache management information 112, the host I/O controller 120 determined whether the relevant parity corresponding to the read data has already been staged in the cache area 111. If the relevant parity has already been staged there, the host I/O controller 120 performs a process in step S17. If no relevant parity has been staged there yet, the host I/O controller 120 performs a process in step S16.

[Step S16] Like in step S14, the host I/O controller 120 obtains the read data from the DE 200 via the RAID controller 130 if the read-requested read data is not stored on the cache area 111 (if mishit). The host I/O controller 120 stages the obtained read data in the cache area 111.

In addition to this, the host I/O controller 120 obtains the parity corresponding to the read data from the DE 200 via the RAID controller 130. The host I/O controller 120 stages the obtained relevant parity in a cache page in the cache area 111 which is different from the cache page in which the read data is staged. At this point, information indicating that the relevant parity is stored there is registered in an entry to the cache management information 112 which corresponds to the cache page of the staging destination. Furthermore, the parity attribute is registered in the entry.

Noted that if the read data is stored on the cache area 111 (if cache hit), the host I/O controller 120 only stages the relevant parity in step S16.

[Step S17] The host I/O controller 120 responds to the host apparatus 20 by sending the read data to the host apparatus 20. Incidentally, if the host I/O controller 120 performs the process in step S16, the host I/O controller 120 may respond to the host apparatus 20 before obtaining the relevant parity from the DE 200, in the case where the host I/O controller 120 has already obtained the read data from the DE 200.

[Step S18] The host I/O controller 120 registers a record including the information on the read request received in step S11 in the history information 114.

In the process in FIG. 6, upon receipt of the request to read from the object volume, the host I/O controller 120 obtains the relevant parity in addition to the read data from the DE 200, and stages the read data and the relevant parity into the cache area 111. Incidentally, the host I/O controller 120 does not stage the parity if the size of the read data is equal to the stripe size. This is because: in a case where the read data whose size is equal to the stripe size has already been staged on the cache area 111, the new parity may be calculated using the staged pre-updated read data instead of using the relevant parity when an update to the read data is requested and the updated data is written back. In this case, therefore, the staging of no relevant parity makes it possible to reduce the amount of time requested to complete the read process in FIG. 6, and to improve the efficiency of using the cache area 111.

Figure 7:
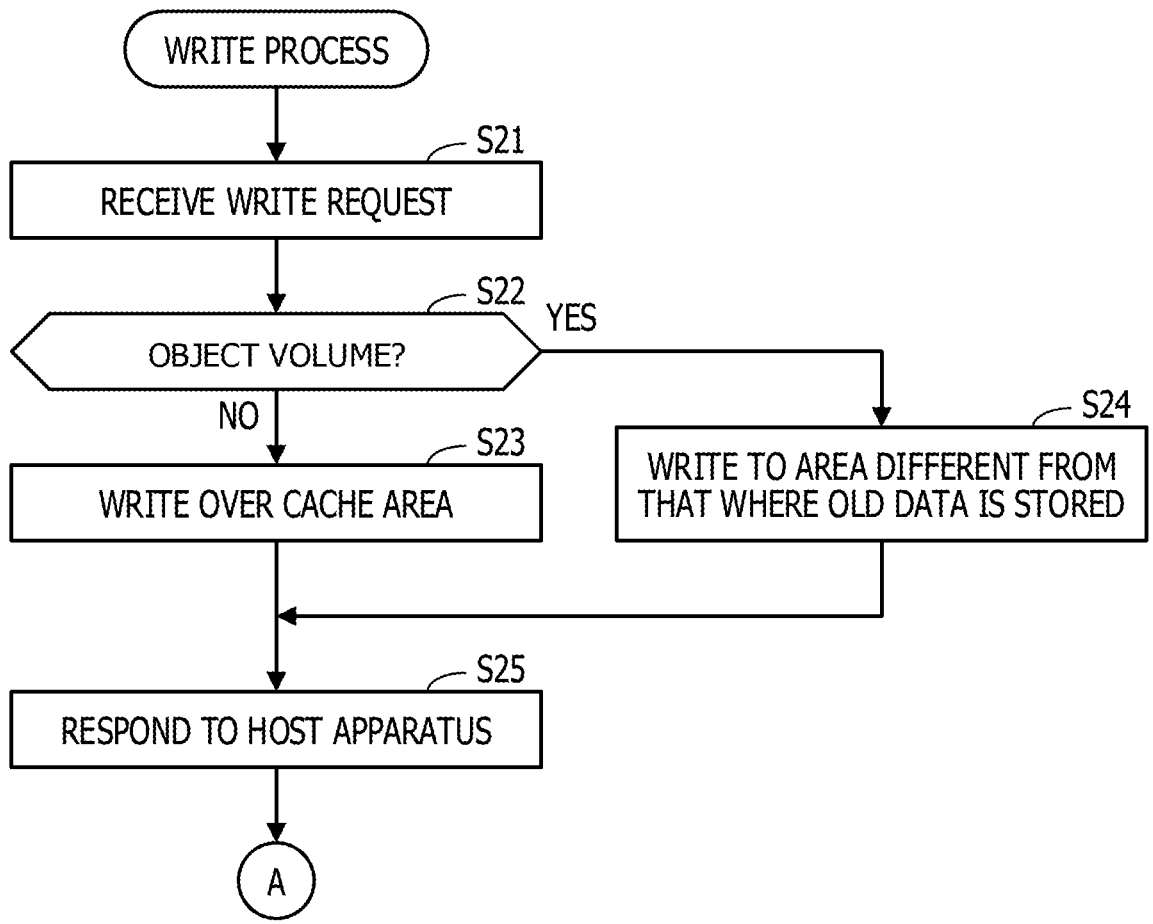
FIG. 7 is a flowchart (1) illustrating an example of a write process.
Figure 8:
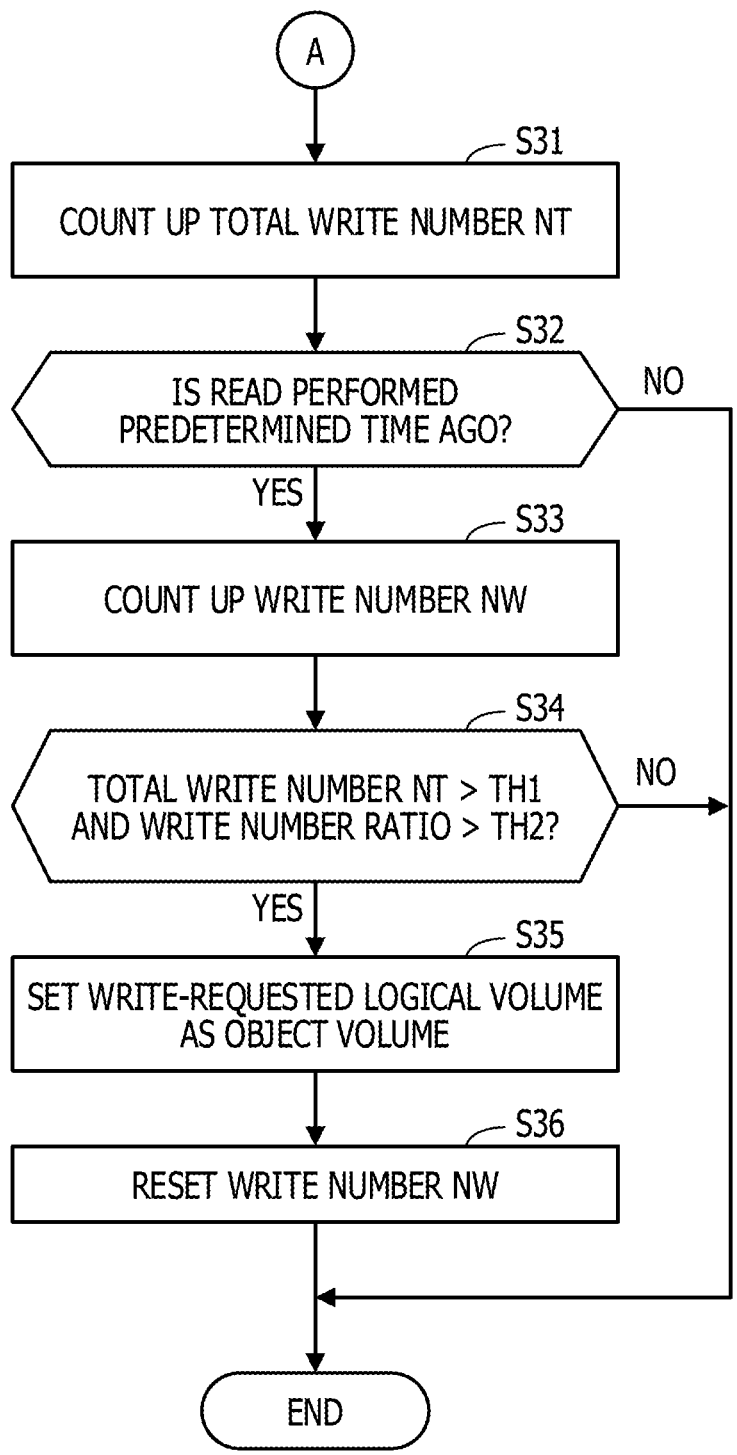
FIG. 8 is a flowchart (2) illustrating an example of the write process.

Next, FIGS. 7 and 8 are flowcharts illustrating an example of the write process. Incidentally, for the purpose of simplifying the descriptions, it is assumed that a stripe size is an upper limit of the size of data which may be written by one request in FIGS. 7 and 8.

[Step S21] The host I/O controller 120 receives a write request from the host apparatus 20.

[Step S22] By referring to the object volume information 115, the host I/O controller 120 determines whether the write-requested logical volume is set as the object volume. If the logical volume is set as the object volume, the host I/O controller 120 performs a process in step S24. If the logical volume is not set as the object volume, the host I/O controller 120 performs a process in step S23.

[Step S23] If data (old data) in the write-requested address range is stored on the cache area 111 (if cache hit), the host I/O controller 120 overwrites the old data in the cache area 111 with the write-requested new data. At this point, if the entry to the cache management information 112 corresponding to the cache page on which the old data is stored has a read data attribute, the read data attribute is updated to the write data attribute. In addition, the new data stored into the cache page by the overwrite is managed as dirty data which requests a write-back.

Noted that if the old data is not stored on the cache area 111 (if mishit), the host I/O controller 120 stores the new data into a new cache page in the cache area 111.

[Step S24] If the old data is stored on the cache area 111 (if cache hit), the host I/O controller 120 writes the new data to a cache page in the cache area 111 which is different from the cache page where the old data is stored. At this point, the entry to the cache management information 112 corresponding to the cache page to which the new data is written is set as having a new data attribute. Thereafter, information indicating that the write data is stored into the address range on the write-requested logical volume is registered in the entry. Furthermore, if the entry to the cache management information 112 corresponding to the cache page on which the old data is stored has a read data attribute, the read data attribute is updated to a write data attribute. Moreover, the old data is managed as dirty data which requests a write-back.

Noted that if the old data is not stored on the cache area 111 (if mishit), the host I/O controller 120 stores the new data into a cache page with the write data attribute in the cache area 111.

[Step S25] The host I/O controller 120 responds to the host apparatus 20 by sending a write completion notice to the host apparatus 20.

After that, the host I/O controller 120 causes the object volume setting section 140 to perform a process in FIG. 8.

[Step S31] The object volume setting section 140 counts up the total write number Nt corresponding to the write-requested logical volume.

[Step S32] Referring to the history information 114, the object volume setting section 140 specifies the address range on the write-requested logical volume, and determined whether a read has been performed for a predetermined length of time. If a read has been performed, the object volume setting section 140 performs a process in step S33.

If no read has been performed, the object volume setting section 140 terminates the write process.

[Step S33] The object volume setting section 140 counts up the write number Nw corresponding to the write-requested logical volume.

[Step S34] The object volume setting section 140 determines whether the two following conditions are satisfied. A first condition is a condition that the total write number Nt is greater than a threshold TH1. A second condition is a condition that a write number ratio is greater than a threshold TH2. The write number ratio is a ratio of the write number Nw to the total write number Nt.

If the two conditions are satisfied, the object volume setting section 140 performs a process in step S35. If all the two conditions are not satisfied, the object volume setting section 140 terminates the write process.

[Step S35] The object volume setting section 140 sets the write-requested logical volume as the object volume. To put it specifically, the object volume setting section 140 registers the volume name of the write-requested logical volume in the object volume information 115.

In this respect, if the second condition is satisfied in step S34, the object volume setting section 140 determines that the number of writes which are performed to the same address range on the logical volume within the certain length of time after each read is large. Meanwhile, the accuracy of the determination based on the second condition becomes higher as the total write number Nt, the denominator of the write number ratio, becomes larger to a certain extent. In this embodiment, therefore, the object volume setting section 140 determines the logical volume as the object volume in the case where the first condition is satisfied in addition to the second condition being satisfied. Accordingly, this embodiment may determine the object volume accurately.

[Step S36] The object volume setting section 140 resets the write number Nw corresponding to the write-requested logical volume at "0".

Figure 9:
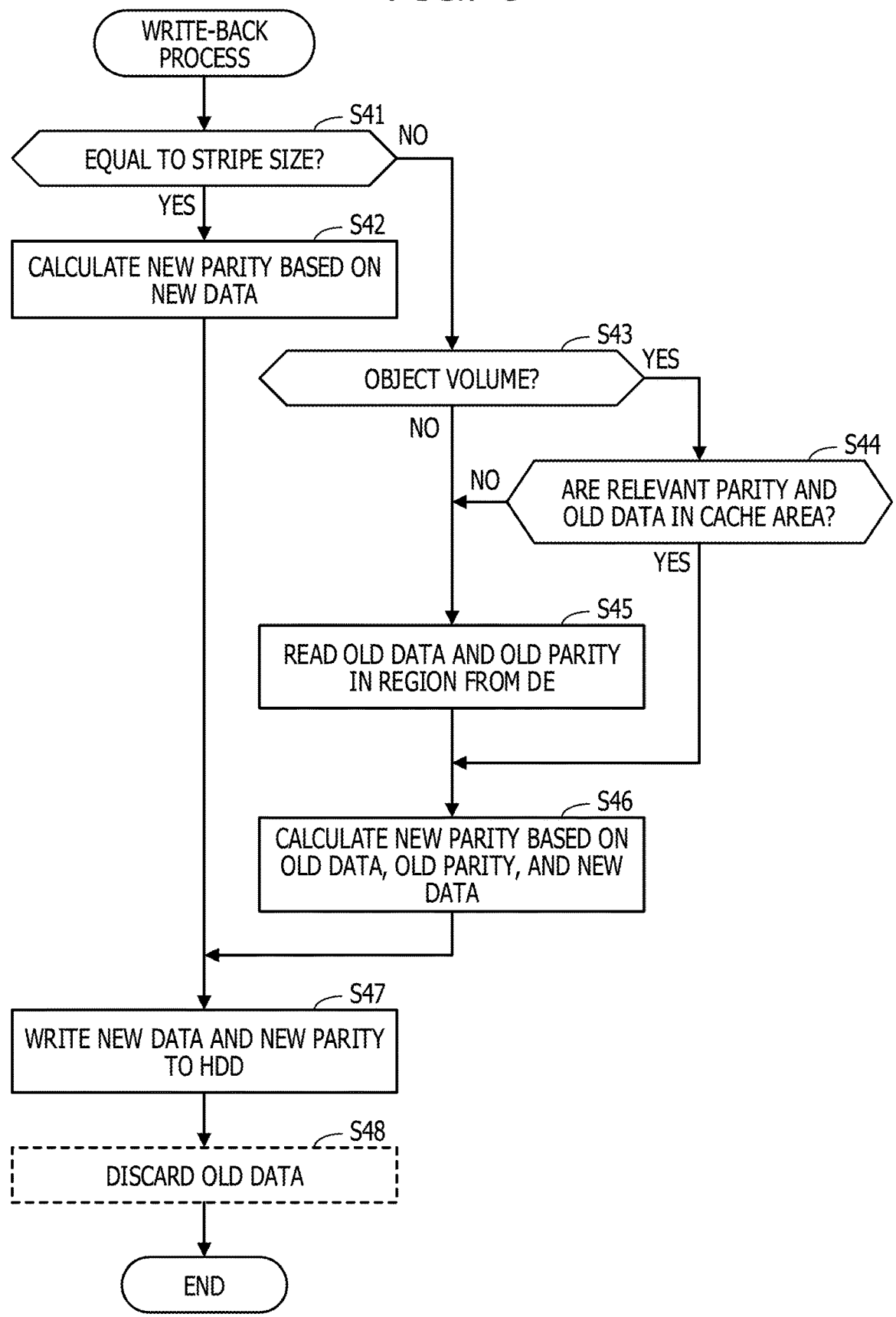
FIG. 9 is a flowchart illustrating a write-back process.

Next, FIG. 9 is a flowchart illustrating an example of the write-back process. The host I/O controller 120 selects write-back data from data which are stored on the cache area 111 and managed as dirty data. For example, from the data managed as the dirty data, data which is updated the earliest is selected as the write-back data. The host I/O controller 120 specifies address information on the selected write-back data (the volume name, logical address and data size of the logical volume) to the RAID controller 130, and requests the RAID controller 130 to perform the write-back process. The process illustrated in FIG. 9 begins with this.

[Step S41] The RAID controller 130 determines whether the size of the write-back data is equal to the stripe size. If the data size is equal to the stripe size, the RAID controller 130 performs a process in step S42. If the data size is less than the stripe size, the RAID controller 130 performs a process in step S43.

[Step S42] The RAID controller 130 calculates a new parity based on the write-back data.

[Step S43] Referring to the object volume information 115, the RAID controller 130 determines whether the logical volume to which the write-back data belonging is set as the object volume. If the logical volume is set as the object volume, the RAID controller 130 performs a process in step S44. If the logical volume is not set as the object volume, the RAID controller 130 performs a process in step S45.

[Step S44] Referring to the cache management information 112, the RAID controller 130 determines whether the relevant parity and the old data which correspond to the write-back data are stored on the cache area 111. If both of them are stored on the cache area 111, the RAID controller 130 performs a process in step S46. If both of them are not stored on the cache area 111, the RAID controller 130 performs the process in step S45.

Noted that a case where the relevant parity is not stored on the cache area 111 is a case where no entry to the parity attribute indicating that the parity corresponding to the write-back address range is stored on the cache page exists in the cache management information 112.

Meanwhile, a case where the old data is not stored on the cache area 111 is a case where the old data has already been overwritten with the new data. In this case, only the entry to the write data attribute indicating that the data on the write-back address range exists in the cache management information 112, while no entry to the new data attribute indicating that the data on the same address range is stored on the cache page exists in the cache management information 112.

[Step S45] The RAID controller 130 reads the old data and the old parity corresponding to the write-back address range from the DE 200. Incidentally, if the RAID controller 130 determines in step S44 that only the relevant parity is not stored thereon, the RAID controller 130 reads only the only old parity from the DE 200.

[Step S46] The RAID controller 130 calculates the new parity based on the old data, the old parity, and the new data which correspond to the write-back address range.

Here, complementary descriptions are provided for steps S44 to S46. If the RAID controller 130 determines in step S44 that only the relevant parity is not stored thereon, the RAID controller 130 determines in step S45 whether all the data on all the stripe including the old data is stored on the cache area 111. If the data on all the stripe are not stored on the cache area 111, the RAID controller 130 reads only the old parity from the DE 200 in step S45.

On the other hand, if the data on all the stripe are stored on the cache area 111, the RAID controller 130 calculates the new parity in the following way. The RAID controller 130 overwrites the area corresponding the old data, which is included in the data on all the stripe stored in the cache area 111, with the new data. The RAID controller 130 reads the overwritten data on all the stripe from the cache area 111, and calculates the new parity based on these read data. In this case, no write penalty occurs.

[Step S47] The RAID controller 130 writes the new data and the new parity calculated in step S42 or S46 to a corresponding HDD in the DE 200.

[Step S48] If the old data is stored on the cache area 111, the RAID controller 130 discards this old data. For example, the RAID controller 130 overwrites the old data on the cache area 111 with the new data, and thereby erases the previous new data from the cache area 111. Meanwhile, if the relevant parity corresponding to the discarded old data is stored on the cache area 111, the RAID controller 130 overwrites this relevant parity with the calculated new parity. Thereby, the RAID controller 130 updates the old relevant parity. If the new data is requested to be re-updated, the RAID controller 130 may use the updated relevant parity left on the cache area 111 to calculate the new parity corresponding to the re-updated data.

Through the above process performed by the CM 100, the logical volume which satisfies the condition that "the write number ratio is greater than the predetermined threshold TH2" in step S34 in FIG. 8 is set as the object volume. By this, the logical volume having a high possibility of being requested to be written to the same address range within the short length of time after the read request is issued may be set as the object volume.

Thereafter, through a process illustrated in FIG. 9, the relevant parity corresponding to the data on the logical volume set as the object volume in the above-discussed way is staged in the cache area 111 in advance. Thereby, only the relevant parity having a high possibility of being used to calculate the new parity in the write-back process is staged in the cache area 111 in advance. Thus, it is possible to decrease the number of occurrences of the write penalty during the write-back process while improving the efficiency of using the cache area 111.

The decrease in the number of occurrences of the write penalty makes it possible to reduce the load on the write-back process, and accordingly to enhance the CM 100's performance of response to the access request from the host apparatus 20. Thus, it is possible to enhance the CM 100's storage control operation performance while inhibiting the requested capacity of the cache area 111.

Noted that the relevant parity staged in the cache area 111 is not necessarily used to calculate the new parity. The relevant parity, therefore, is deleted from the cache area 111 through the following process for the purpose of effectively using the cache area 111.

For example, in a case where the remaining capacity of the cache area 111 becomes equal to or less than a predetermined capacity, the RAID controller 130 deletes a predetermined number of relevant parities which are stored into the cache area 111 (or updated) the earliest among the relevant parities existing in the cache area 111. In this case, the RAID controller 130 deletes a predetermined number of relevant parities which have not been used for the longest time. Otherwise, the RAID controller 130 may be configured to delete each relevant parity existing in the cache area 111 each time a certain length of time has passed since the relevant parity is stored into the cache area 111 (updated). In this case, the RAID controller 130 deletes each relevant parity which has not been used for the certain length of time.

Furthermore, in the case where the RAID controller 130 deletes old data from the cache area 111 in response to the decrease in the remaining capacity of the cache area 111, if relevant parities corresponding to the data remain on the cache area 111, the RAID controller 130 deletes the relevant parities as well from the cache area 111.

Here, FIG. 10 is a diagram illustrating a specific example of how the read process and the write process are performed. It is assumed that a logical volume LV1 is set as the object volume in FIG. 10. It is further assumed that HDDs 211 to 214 installed in the DE 200 are assigned to the logical volume LV1 and the logical volume LV1 is controlled by RAID 5.

Furthermore, data D11 to D16 exist on the consecutive address spaces in the logical volume LV1. In addition, the data D11, D12, D13 are stored respectively on the HDDs 211, 212, 213, while parity P11 calculated based on the data D11 to D13 is stored on the HDD 214. Moreover, the data D14, D15, D16 are stored respectively on the HDDs 211, 212, 214, while parity P12 calculated based on the data D14 to D16 is stored on the HDD 213.

It is assumed that the host apparatus 20 issues a read request for reading the data D12 in the above-discussed condition. In this case, as illustrated by the left half of FIG. 10, the data D12 is read from the HDD 212. The read data D12 is stored into the cache area 111, and is sent to the host apparatus 20. In parallel to this, the parity P11, which is the relevant parity, is read from the HDD 214, and is stored into the cache area 111.

Thereafter, it is assumed that the host apparatus 20 issues a write request for updating the data D12 with data D12a. In this case, as illustrated in the right half of FIG. 10, the data D12a is stored into a part of the cache area 111 which is different from the part where the data D12 is stored, and a response is sent to the host apparatus 20. Thereafter, in order to perform the write-back process on the data D12a, the pre-updated data D12, the pre-updated parity P11, and the updated data D12a are read from the cache area 111, and an updated parity P11a is calculated by operating an exclusive or (XOR) on the pre-updated data D12, the pre-updated parity P11, and the updated data D12a. The updated data D12a is written to the HDD 212, while the updated parity P11a is written to the HDD 214.

Since as discussed above, the data D12 and the parity P11 requested for the parity calculation are staged in the cache area 111 in advance, the write-back process does not request the data D12 to be read from the HDD 212, or the parity P11 to be read from the HDD 214. This makes it possible to decrease the amount of time requested to complete the write-back process, and to reduce the accompanying process load.

Although the above descriptions have discussed the CM 100's process in which the logical volume settable as the object volume is controlled by RAID 5, the logical volume controlled by RAID 4 or RAID 6 may be also set as the object volume. For example, in the case where the logical volume controlled by RAID 6 is set as the object volume, two relevant parities are staged in the cache area 111, and are used to calculate two new relevant parities in the write-back process.

Next, descriptions are provided for how an object volume management process determines whether to remove a logical volume once set as an object volume from the object volume under what conditions. Two examples of the object volume management process are hereinbelow explained.

Figure 11:
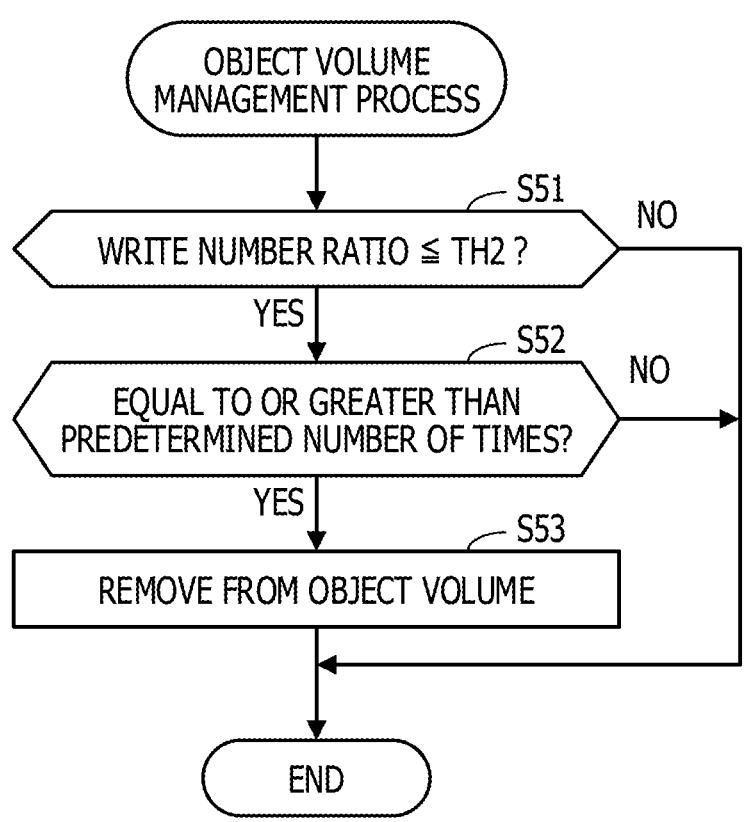
FIG. 11 is a flow chart illustrating a first example of an object volume management process.

FIG. 11 is a flow chart illustrating a first example of the object volume management process. The process illustrated in FIG. 11 is periodically performed on, for example, each logical volume set as the object volume.

[Step S51] The object volume setting section 140 determines whether the write number ratio concerning the logical volume set as the object volume (see step S34 in FIG. 8) is not greater than the threshold TH2. If the write number ratio is not greater than the threshold TH2, the object volume setting section 140 performs a process in step S52. If the write number ratio is greater than the threshold TH2, the object volume setting section 140 terminates the object volume management process.

[Step S52] The object volume setting section 140 determines whether the number of times the write number ratio is consecutively determined as being not greater than the threshold TH2 is not less than a predetermined number. If the determined number of times is not less than the predetermine number, the object volume setting section 140 performs a process in step S53. If the determined number of times is less than the predetermine number, the object volume setting section 140 terminates the object volume management process.

[Step S53] The object volume setting section 140 deletes the volume name of the logical volume, which is the object of the object volume management process, from the object volume information 115. Thereby, the logical volume which is the object of the object volume management process is removed from the object volume.

Figure 12:
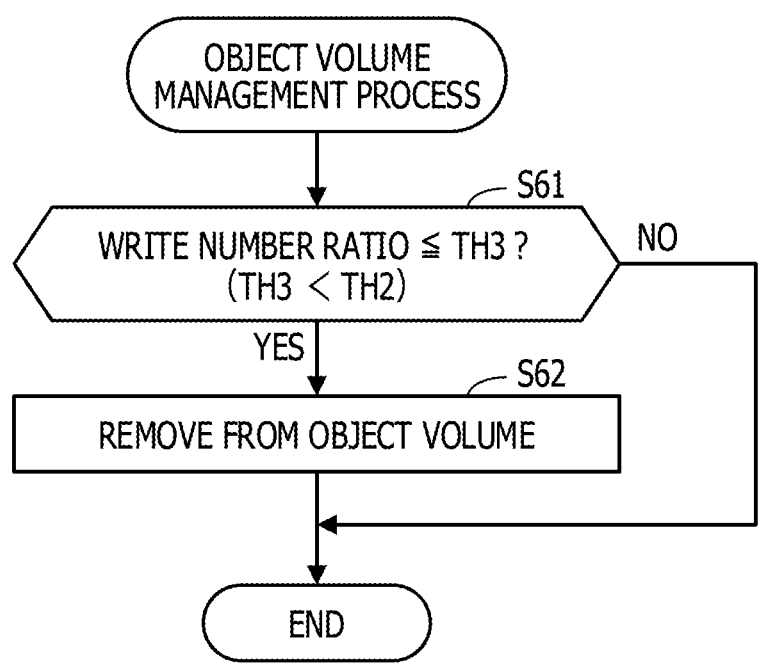
FIG. 12 is a flow chart illustrating a second example of the object volume management process.

FIG. 12 is a flow chart illustrating a second example of the object volume management process. The process illustrated in FIG. 12 is periodically performed on, for example, each logical volume set as the object volume.

[Step S61] The object volume setting section 140 determines whether the write number ratio concerning the logical volume set as the object volume (see step S34 in FIG. 8) is not greater than a threshold TH3. The threshold TH3 is set at a value which is less than the threshold TH2 used in step S34 in FIG. 8. If the write number ratio is not greater than the threshold TH3, the object volume setting section 140 performs a process in step S62. If the write number ratio is greater than the threshold TH3, the object volume setting section 140 terminates the object volume management process.

[Step S62] The object volume setting section 140 deletes the volume name of the logical volume, which is the object of the object volume management process, from the object volume information 115. Thereby, the logical volume which is the object of the object volume management process is removed from the object volume.

Incidentally, in the first example illustrated in FIG. 11, until the write number ratio as being not greater than the threshold TH2 becomes not less than a predetermined number of times, the logical volume which is the object of the object volume management process is left set as the object volume. Meanwhile, in the second example illustrated in FIG. 12, until the write number ratio becomes not greater than the threshold TH3 which is less than the threshold TH2, the logical volume which is the object of the object volume management process is left set as the object volume. In each case of the object volume management process, the logical volume which is the object of the object volume management process is not removed from the object volume only if the write number ratio becomes equal to or less than the threshold TH2. This scheme makes it possible to avoid frequent repetition of the setting of a logical volume as the object volume and the removal of the logical volume from the object volume.

Noted that a process as follows may be used as another example of the object volume management process. For example, only during a specific length of time, such as a length of time for which the host apparatus 20 is performing the business process, a logical volume may be set as the object volume. In addition, once a logical volume is set as the object volume, the logical volume is left set as the object volume until the above-mentioned specific length of time ends.

Noted that the process functions of the devices (for example, the storage control device 1, and the CM 100) discussed in each embodiment described above may be implemented using a computer. In this case, the process functions are implemented on the computer by: providing the computer with the programs describing the process contents of the functions which the devices are expected to have; and causing the computer to execute the programs. The programs describing the process contents may be recorded in a computer-readable recording medium. Examples of the computer-readable recording medium include a magnetic storage, an optical disk, a magneto-optic recording medium, and a semiconductor memory. Examples of the magnetic storage include a hard disk drive (HDD), a flexible disk (FD), and a magnetic tape. Examples of the optical disk include a compact disk-read only memory (CD-ROM), a CD recordable (R) and rewritable (RW). An example of the magneto-optical recording medium is a magneto-optical disk (MO).

The programs are distributed through, for example, sales of a portable recording medium, such as a CD-ROM, in which the programs are recorded. In addition, the programs may be stored into a storage device in a server computer, and transferred from the server computer to another computer through a network.

The computer to execute the programs stores the programs recorded in the portable recording medium, or the programs transferred to the computer from the server computer, into its own storage device. Thereafter, the computer reads the programs from its own storage device, and performs the processes according to the programs. Incidentally, the computer may be configured to read the programs directly from the portable recording medium, and to perform the processes according to the programs. Otherwise, the computer may be configured such that each time a program is transferred to the computer from the server computer to which the computer is coupled through the network, the computer serially performs a process according to the received program.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A control device comprising:
a memory; and
a processor coupled to the memory and configured to:
receive, from an information processing apparatus, a first write request to store first data into a storage region of a storage apparatus;
calculate a first parity corresponding to the first data;
store the first data and the first parity into the storage region so that the first data is stored redundantly by using the first parity;
based on a plurality of accesses to the storage region from the information processing apparatus, identify a certain area which is included in the storage region and has a higher possibility that a write process to the certain area will be requested after a read process from the certain area is requested;
receive, from the information processing apparatus, a read request which requests to read the first data stored in the storage region;
when at least a part of the first data is stored in the certain area, read the first data and the first parity from the storage region, and store the first data and the first parity into the memory;
transmit the read first data to the information processing apparatus;
receive, from the information processing apparatus, a second write request which requests to store a second data into the storage region so that the first data is updated by the second data;

calculate second parity based on the second data, the first data stored in the memory and the first parity stored in the memory; and store the second data and the second parity into the storage region.

2. The control device according to claim 1, wherein the processor is configured to:

identify a first area in the storage region as the certain area when a first number is equal to or greater than a first value, the first number indicating a number of a write request for the first area received within a first time period after a read request for the first area is received.

3. The control device according to claim 2, wherein the storage region is divided into a plurality of partial areas, and the processor is configured to:

for each of the plurality of partial areas, count the first number; and identify the certain area from the plurality of partial areas based on a result of counting the first number for each of the plurality of partial areas.

4. The control device according to claim 3, wherein the processor is configured to:

identify a first partial area of the plurality of partial areas as the certain area when a ratio of the first number of the first partial area to a total number of the first number of the plurality of partial areas is equal to or greater than a second value.

5. The control device according to claim 4, wherein the processor is configured to:

identify the first partial area as the certain area when the ratio is greater than the second value and the total number is greater than a third value.

6. The control device according to claim 1, wherein the processor is configured to:

when receiving the second write request, store the second data into the memory;

transmit a completion notice to the information processing apparatus; and after transmitting the completion notice, calculate the second parity based on the first data, the second data, and the first parity stored in the memory.

7. A method of controlling a storage apparatus including a storage region, the method comprising:

receiving, from an information processing apparatus, a first write request to store first data into the storage apparatus;

calculating a first parity corresponding to the first data;

storing the first data and the first parity into the storage region so that the first data is stored redundantly by using the first parity;

based on a plurality of accesses to the storage region from the information processing apparatus, identifying a certain area which is included in the storage region and has a higher possibility that a write process to the certain area will be requested after a read process from the certain area is requested;

receiving, from the information processing apparatus, a read request which requests to read the first data stored in the storage region;

when at least a part of the first data is stored in the certain area, reading the first data and the first parity from the storage region, and store the first data and the first parity into a memory;

transmitting the read first data to the information processing apparatus;

receiving, from the information processing apparatus, a second write request which requests to store a second data into the storage region so that the first data is updated by the second data;

calculating second parity based on the second data, the first data stored in the memory and the first parity stored in the memory; and storing the second data and the second parity into the storage region.

8. The method according to claim 7, wherein in the identifying of the certain area, a first area in the storage region is identified as the certain area when a first number is equal to or greater than a first value, the first number indicating a number of a write request for the first area received within a first time period after a read request for the first area is received.

9. The method according to claim 8, wherein the storage region is divided into a plurality of partial areas, the first number is counted for each of the plurality of partial areas, and in the identifying of the certain area, the certain area is identified from the plurality of partial areas based on a result of counting the first number for each of the plurality of partial areas.

10. The method according to claim 9, wherein in the identifying of the certain area, a first partial area of the plurality of partial areas is identified as the certain area when a ratio of the first number of the first partial area to a total number of the first number of the plurality of partial areas is equal to or greater than a second value.

11. The method according to claim 10, wherein in the identifying of the certain area, the first partial area is identified as the certain area when the ratio is greater than the second value and the total number is greater than a third value.

12. The method device according to claim 7, further comprising:

when receiving the second write request, storing the second data into the memory;

transmitting a completion notice to the information processing apparatus; and after the transmitting of the completion notice, calculating the second parity based on the first data, the second data, and the first parity stored in the memory.

13. A non-transitory computer-readable storage medium storing a program that causes a control device to execute a process, the process comprising:

receiving, from an information processing apparatus, a first write request to store first data into a storage apparatus including a storage region;

calculating a first parity corresponding to the first data;

storing the first data and the first parity into the storage region so that the first data is stored redundantly by using the first parity;

based on a plurality of accesses to the storage region from the information processing apparatus, identifying a certain area which is included in the storage region and has a higher possibility that a write process to the certain area will be requested after a read process from the certain area is requested;

receiving, from the information processing apparatus, a read request which requests to read the first data stored in the storage region;

when at least a part of the first data is stored in the certain area, reading the first data and the first parity from the storage region, and store the first data and the first parity into a memory;

transmitting the read first data to the information processing apparatus;

receiving, from the information processing apparatus, a second write request which requests to store a second data into the storage region so that the first data is updated by the second data;

calculating second parity based on the second data, the first data stored in the memory and the first parity stored in the memory; and storing the second data and the second parity into the storage region.

14. The non-transitory computer-readable storage medium according to claim 13, wherein
in the identifying of the certain area, a first area in the storage region is identified as the certain area when a first number is equal to or greater than a first value, the first number indicating a number of a write request for the first area received within a first time period after a read request for the first area is received.

15. The non-transitory computer-readable storage medium according to claim 14, wherein
the storage region is divided into a plurality of partial areas,
the first number is counted for each of the plurality of partial areas, and
in the identifying of the certain area, the certain area is identified from the plurality of partial areas based on a result of counting the first number for each of the plurality of partial areas.

16. The non-transitory computer-readable storage medium according to claim 15, wherein
in the identifying of the certain area, a first partial area of the plurality of partial areas is identified as the certain area when a ratio of the first number of the first partial area to a total number of the first number of the plurality of partial areas is equal to or greater than a second value.

17. The non-transitory computer-readable storage medium according to claim 16, wherein
in the identifying of the certain area, the first partial area is identified as the certain area when the ratio is greater than the second value and the total number is greater than a third value.

18. The non-transitory computer-readable storage medium device according to claim 13, the process further comprising:
when receiving the second write request, storing the second data into the memory;
transmitting a completion notice to the information processing apparatus; and
after the transmitting of the completion notice, calculating the second parity based on the first data, the second data, and the first parity stored in the memory.

* * * * *